(12) United States Patent
Lee

(10) Patent No.: US 10,761,132 B2
(45) Date of Patent: Sep. 1, 2020

(54) INTEGRATED CIRCUIT CHIP AND SEMICONDUCTOR DEVICE INCLUDING THE SAME

(71) Applicant: SK hynix Inc., Gyeonggi-do (KR)

(72) Inventor: Dong-Uk Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 96 days.

(21) Appl. No.: 16/199,297

(22) Filed: Nov. 26, 2018

(65) Prior Publication Data

US 2019/0293711 A1 Sep. 26, 2019

(30) Foreign Application Priority Data

Mar. 26, 2018 (KR) ........................ 10-2018-0034370

(51) Int. Cl.
| | |
|---|---|
| *G01R 31/28* | (2006.01) |
| *H01L 25/065* | (2006.01) |
| *H01L 25/18* | (2006.01) |
| *H01L 23/48* | (2006.01) |

(52) U.S. Cl.
CPC ........ *G01R 31/2853* (2013.01); *H01L 23/481* (2013.01); *H01L 25/0657* (2013.01); *H01L 25/18* (2013.01)

(58) Field of Classification Search
CPC .............. G01R 31/2853; H01L 23/481; H01L 25/0657; H01L 25/18
See application file for complete search history.

(56) References Cited

U.S. PATENT DOCUMENTS

| | | | |
|---|---|---|---|
| 8,970,265 B2 * | 3/2015 | McIntosh | H02M 1/08 327/112 |
| 9,658,255 B2 | 5/2017 | DiRocco et al. | |
| 2017/0003340 A1 | 1/2017 | Chakrabarty et al. | |

* cited by examiner

*Primary Examiner* — Clayton E. LaBalle
*Assistant Examiner* — Michael A Harrison
(74) *Attorney, Agent, or Firm* — IP & T Group LLP

(57) ABSTRACT

A semiconductor device includes a first integrated chip; a second integrated chip; a plurality of reference through-chip vias formed through the first and second integrated circuit chips; and at least a normal through-chip via formed through the first and second integrated circuit chips, wherein the first integrated circuit chip comprises: a plurality of reference sourcing circuits suitable for sourcing a reference current to the respective reference through-chip vias; and at least a sourcing circuit suitable for sourcing the reference current to the normal through-chip via, and wherein the second integrated circuit chip comprises: a plurality of reference sinking circuits suitable for sinking currents flowing through the respective reference through-chip vias; a line suitable for electrically coupling the plurality of reference through-chip vias; a comparison voltage generation circuit suitable for generating a plurality of comparison voltages based on a voltage of the line; at least a sinking circuit suitable for sinking a current flowing through the normal through-chip via; and a comparison circuit suitable for comparing the voltage of the normal through-chip via to the plurality of comparison voltages.

19 Claims, 5 Drawing Sheets

INTEGRATED CIRCUIT CHIP AND SEMICONDUCTOR DEVICE INCLUDING THE SAME

CROSS-REFERENCE TO RELATED APPLICATION

This application claims priority under 35 U.S.C. § 119(a) to Korean Patent Application No. 10-2018-0034370 filed on Mar. 26, 2018, which is incorporated herein by reference in its entirety.

BACKGROUND

1. Field

Various exemplary embodiments of the present invention relate generally to an integrated circuit chip and a semiconductor device including a plurality of integrated circuit chips.

2. Discussion of the Related Art

Recently, the capacity and operating speed of a semiconductor memory used as a memory device in most electronic systems have rapidly increased. Furthermore, various attempts are made to mount a memory having a larger capacity within a narrower area while efficiently driving the memory.

Also, in order to improve the integration density of a memory device, the three-dimensional (3D) arrangement technology for stacking a plurality of memory chips has been applied in place of the two-dimensional (2D) arrangement technology. Recent demands for higher integration, and higher capacity memory require a structure which can increase the capacity using a 3D arrangement structure of memory chips and also improve the integration density by reducing the size of each semiconductor chip used in a 3D arrangement structure.

A known 3D arrangement technology includes a through-chip via method, e.g., a through-silicon via (TSV) method. The TSV method is used as an alternative method for overcoming a reduction in transmission speed depending on a distance to a controller on a module, data bandwidth vulnerability, and a reduction in transmission speed depending on a variable on a package. According to the TSV method, a path is formed through a plurality of memory chips, and an electrode is formed in the path in order to perform communication between the stacked chips.

However, when a defect occurs in a TSV, all chips which are stacked in a semiconductor package cannot be used. When the chips cannot be used due to the defect of the TSV which is a very small element of the chip, large cost is wasted. Therefore, there is a demand for a technique capable of correctly determining a TSV defect.

SUMMARY

Various embodiments of the present invention are directed to a technology capable of correctly determining whether a TSV has a defect.

In an embodiment, a semiconductor device may include: a first integrated chip; a second integrated chip; a plurality of reference through-chip vias formed through the first and second integrated circuit chips; and at least a normal through-chip via formed through the first and second integrated circuit chips, wherein the first integrated circuit chip comprises: a plurality of reference sourcing circuits suitable for sourcing a reference current to the respective reference through-chip vias; and at least a sourcing circuit suitable for sourcing the reference current to the normal through-chip via, and wherein the second integrated circuit chip comprises: a plurality of reference sinking circuits suitable for sinking currents flowing through the respective reference through-chip vias; a line suitable for electrically coupling the plurality of reference through-chip vias; a comparison voltage generation circuit suitable for generating a is plurality of comparison voltages based on a voltage of the line; at least a sinking circuit suitable for sinking a current flowing through the normal through-chip via; and a comparison circuit suitable for comparing the voltage of the normal through-chip via to the plurality of comparison voltages.

In an embodiment, an integrated circuit chip may include: a plurality of reference sinking circuits suitable for sinking currents from a plurality of reference through-chip vias, respectively; a line suitable for electrically coupling the plurality of reference through-chip vias; a comparison voltage generation circuit suitable for generating a plurality of comparison voltages based on a voltage of the line; at least a sinking circuit suitable for sinking a current from at least a normal through-chip via; and a comparison circuit suitable for comparing a voltage of the normal through-chip via to the plurality of comparison voltages.

These and other features and advantages of the present invention will become apparent to those skilled in the art of the present invention from the following detailed description in reference to the accompanying drawings.

DETAILED DESCRIPTION

Figure 1:
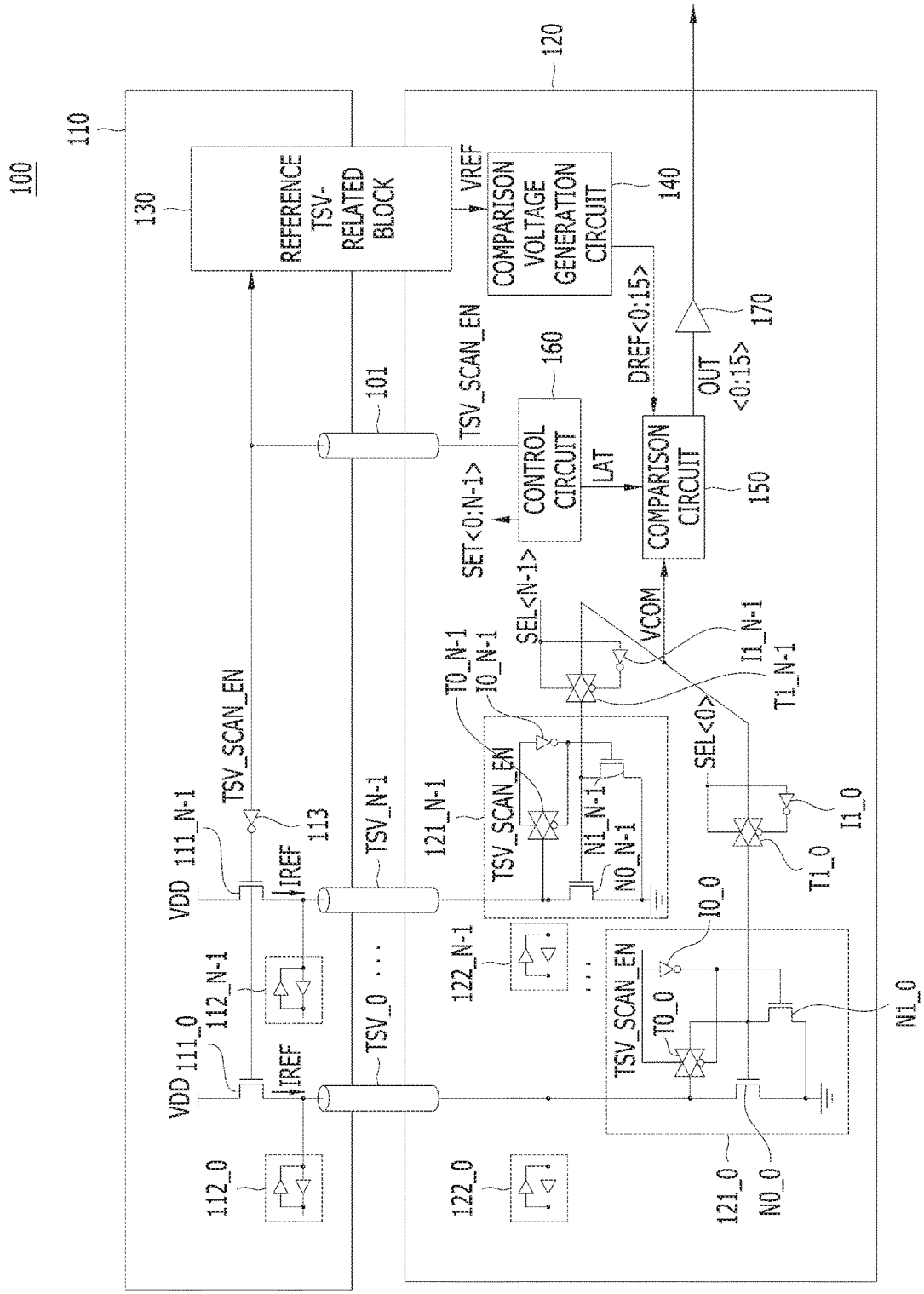
FIG. 1 is a diagram illustrating a semiconductor device, in accordance with an embodiment of the present invention.

Various embodiments of the disclosure of the invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram of a semiconductor device 100 in accordance with an embodiment of the present invention. Referring to FIG. 1, the semiconductor device 100 may include an upper integrated circuit chip 110, a lower integrated circuit chip 120, a reference generation block 130, a plurality of TSVs TSV_0 to TSV_N−1, a plurality of sourcing circuits 111_0 to 111_N−1, a plurality of sinking circuits 121_0 to 121_N−1, a plurality of transmitter/receiver circuits 112_0 to 112_N−1 and 122_0 to 122_N−1, a comparison voltage generation circuit 140, a comparison circuit 150, a control circuit 160 and an output circuit 170. Although FIG. 1 exemplifies that the through-silicon vias (TSVs) are used as through-chip vias, the present invention is not limited thereto.

The upper integrated circuit chip 110 may be stacked over the lower integrated circuit chip 120, and transmit/receive signals to/from the lower integrated circuit chip 120 using the TSVs TSV_0 to TSV_N−1 (i.e., normal TSVs). FIG. 1 illustrates that one integrated circuit 110 is stacked over the lower integrated circuit chip 120. However, a plurality of integrated circuit chips may be stacked over the lower integrated circuit chip 120, and each of the plurality of the stacked integrated circuit chips may be configured in the same manner as the upper integrated circuit chip 110. An example of the semiconductor device 100 having the plurality of integrated circuit chips stacked therein may include a high bandwidth memory (HBM). The semiconductor device 100 may include a different type of integrated circuit chips stacked therein, in addition to the memory such as an HBM.

The upper integrated circuit chip 110 may transmit/receive signals to/from the TSVs TSV_0 to TSV_N−1 using the transmitter/receiver circuits 112_0 to 112_N−1, and the lower is integrated circuit chip 120 may transmit/receive signals to/from the TSVs TSV_0 to TSV_N−1 using the transmitter/receiver circuits 122_0 to 122_N−1. As a result, the transmitter/receiver circuits 112_0 to 112_N−1 of the upper integrated circuit chip 110 and the transmitter/receiver circuits 122_0 to 122_N−1 of the lower integrated circuit chip 120 may transmit/receive signals through the TSVs TSV_0 to TSV_N−1. The transmitter/receiver circuits 112_0 to 112_N−1 and 122_0 to 122_N−1 may be disabled during an operation for detecting defective TSVs among the TSVs TSV_0 to TSV_N−1. The number of TSVs TSV_0 to TSV_N−1 may range from 1 to several tens, several hundreds or several thousands. That is, N is an arbitrary integer equal to or more than 1.

Hereafter, the reference generation block 130, the plurality of sourcing circuits 111_0 to 111_N−1, the plurality of sinking circuits 121_0 to 121_N−1, the comparison voltage generation circuit 140, the comparison circuit 150, the control circuit 160 and the output circuit 170, which are configured to detect defective TSVs among the TSVs TSV_0 to TSV_N−1, will be described.

The reference generation block 130 may generate a reference voltage VREF which is used as a reference signal for determining whether the TSVs TSV_0 to TSV_N−1 have a defect.

Figure 2:
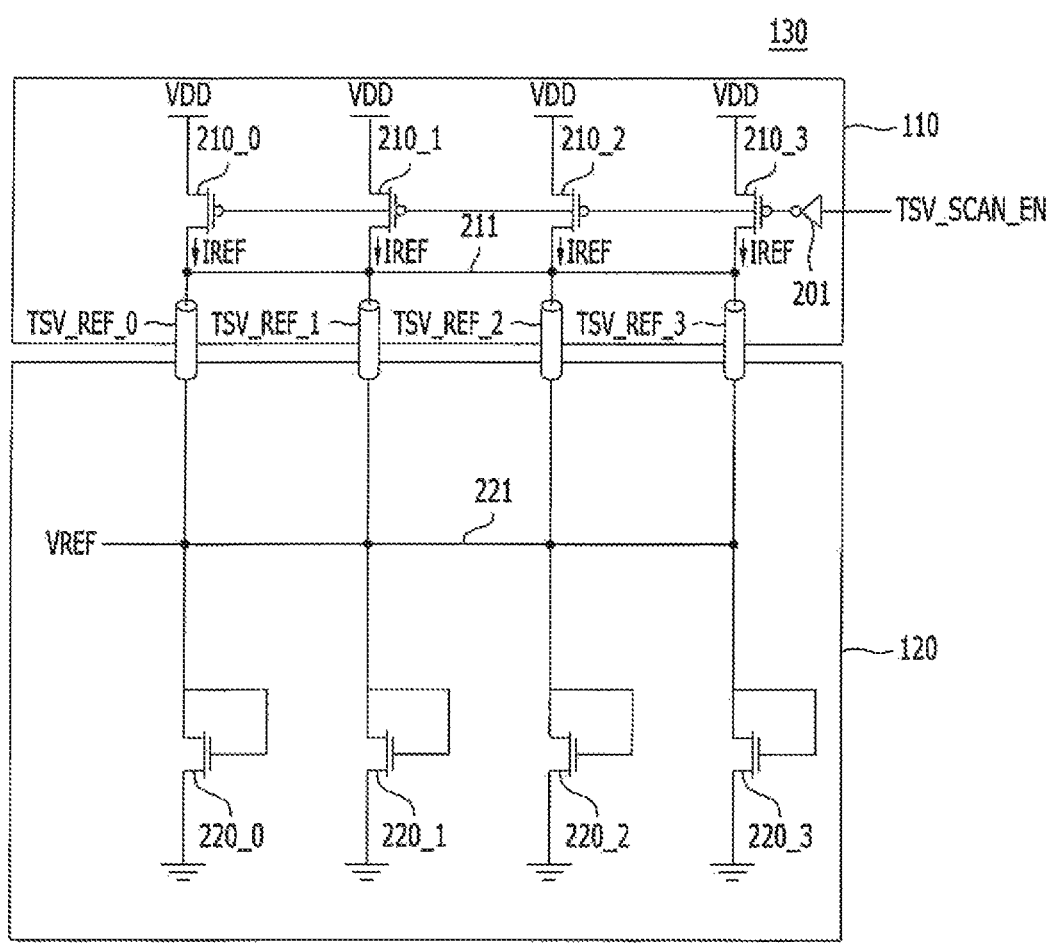
FIG. 2 is a circuit diagram illustrating a reference generation block shown in FIG. 1.

FIG. 2 is a circuit diagram illustrating an exemplary embodiment of the reference generation block 130. Referring to FIG. 2, the reference generation block 130 may include a plurality of reference TSVs TSV_REF_0 to TSV_REF_3, a plurality of reference sourcing circuits 210_0 to 210_3, a plurality of reference sinking circuits 220_0 to 220_3 and lines 211 and 221.

The plurality of reference TSVs TSV_REF_0 to TSV_REF_3 may be formed through the upper integrated circuit chip 110 and the lower integrated circuit chip 120. The plurality of reference TSVs TSV_REF_0 to TSV_REF_3 may be provided for detecting defective TSVs among the TSVs TSV_0 to TSV_N−1.

The plurality of reference sourcing circuits 210_0 to 210_3 may be enabled when a TSV scan enable signal TSV_SCAN_EN is activated, for example, to a high level, and source a reference current IREF to the respective reference TSVs TSV_REF_0 to TSV_REF_3. An inverter 201 may invert the TSV scan enable signal TSV_SCAN_EN, and transfer the inverted signal to the plurality of reference sourcing circuits 210_0 to 210_3, and each of the reference sourcing circuits 210_0 to 210_3 may include a PMOS transistor. The PMOS transistors of the plurality of reference sourcing circuits 210_0 to 210_3 may have the same size such that the plurality of reference sourcing circuits 210_0 to 210_3 source the same amount of current.

The plurality of reference sinking circuits 220_0 to 220_3 may sink currents from the plurality of reference TSVs TSV_REF_0 to TSV_REF_3. Each of the reference sinking circuits 220_0 to 220_3 may include an NMOS transistor. The sources of the NMOS transistors of the plurality of reference sinking circuits 220_0 to 220_3 is may be coupled to a ground terminal, and the gates and drains of the NMOS transistors may be coupled to the respective reference TSVs TSV_REF_0 to TSV_REF_3. The NMOS transistors may have the same size such that the plurality of reference sinking circuits 220_0 to 220_3 may have the same current sinking ability.

The line 211 may electrically couple the plurality of reference TSVs TSV_REF_0 to TSV_REF_3 within the upper integrated circuit chip 110, and the line 221 may electrically couple the plurality of reference TSVs TSV_REF_0 to TSV_REF_3 within the lower integrated circuit chip 120. The better the electrical conductivities of the reference TSVs TSV_REF_0 to TSV_REF_3, the higher the voltage of the line 221. On the other hand, the worse the electrical conductivities of the reference TSVs TSV_REF_0 to TSV_REF_3, the lower the voltage of the line 221. The voltage of the line 221 may become the reference voltage VREF. The reference voltage VREF may indicate the average electrical conductivity of the reference TSVs TSV_REF_0 to TSV_REF_3. The average electrical conductivity of the reference TSVs TSV_REF_0 to TSV_REF_3 may be better reflected into the line 221 by the line 211 electrically coupling the plurality of reference TSVs TSV_REF_0 to TSV_REF_3 within the upper integrated circuit chip 110. Depending on design, the line 211 may be omitted.

Referring back to FIG. 1, the plurality of sourcing circuits 111_0 to 112_N−1 may be enabled when the TSV scan enable signal TSV_SCAN_EN is activated, for example, to a high level, and source the reference current IREF to the TSVs TSV_0 to TSV_N−1. An inverter 113 may invert the TSV scan enable signal TSV_SCAN_EN, and transfer the inverted signal to the plurality of sourcing circuits 111_0 to 111_N−1, and each of the sourcing circuits 111_0 to 111_N−1 may include a PMOS transistor. The PMOS transistors of the plurality of sourcing circuits 111_0 to 111_N−1 may have the same size as the PMOS transistors of the plurality of reference sourcing circuits 210_0 to 210_3 such that the respective sourcing circuits 111_0 to 111_N−1 may source the same amount of current as the respective reference source circuits 210_0 to 210_3.

The plurality of sinking circuits 121_0 to 121_N may be enabled when the TSV scan enable signal TSV_SCAN_EN is activated, for example, to a high level, and sink currents from the TSVs TSV_0 to TSV_N−1. The sinking circuits 121_0 to 121_n may include NMOS transistors N0_0 to N0_N−1, transmission gates T0_0 to T0_N−1, inverters I0_0 to M_N−1 and NMOS transistors N1_0 to N1_N−1, respectively.

The NMOS transistors N0_0 to N0_N−1 may serve to sink currents from the TSVs TSV_0 to TSV_N−1. The NMOS transistors N0_0 to N0_N−1 and the NMOS transistors 220_0 to 220_3 may have the same size, such that the NMOS transistors N0_0 to N0_N-1 have the same current sinking ability as the NMOS transistors 220_0 to 220_3. Inverters I0_0 to I0_N-1 may invert the TSV scan enable signal TSV_SCAN_EN, and transfer the inverted signal to the transmission gates T0_0 to T0_N-1 and the NMOS transistors N1_0 to N1_N-1. The transmission gates T0_0 to T0_N-1 may be turned on when the TSV scan enable signal TSV_SCAN_EN is activated, for example, to a high level, and enable the sinking operations of the NMOS transistors N0_0 to N0_N-1 by coupling the TSVs TSV_0 to TSV_N-1 to the gates of the NMOS transistors N0_0 to N0_N-1. When the TSV scan enable signal TSV_SCAN_EN is deactivated to a low level or the output signals of the inverters I0_0 to I0_N-1 are at a high level, the NMOS transistors N1_0 to N1_N-1 may be turned on to maintain the NMOS transistors N0_0 to NO N-1 in an off state.

The comparison voltage generation circuit 140 may generate a plurality of comparison voltages DREF<0:15> using the reference voltage VREF generated by the reference generation block 130.

Figure 3:
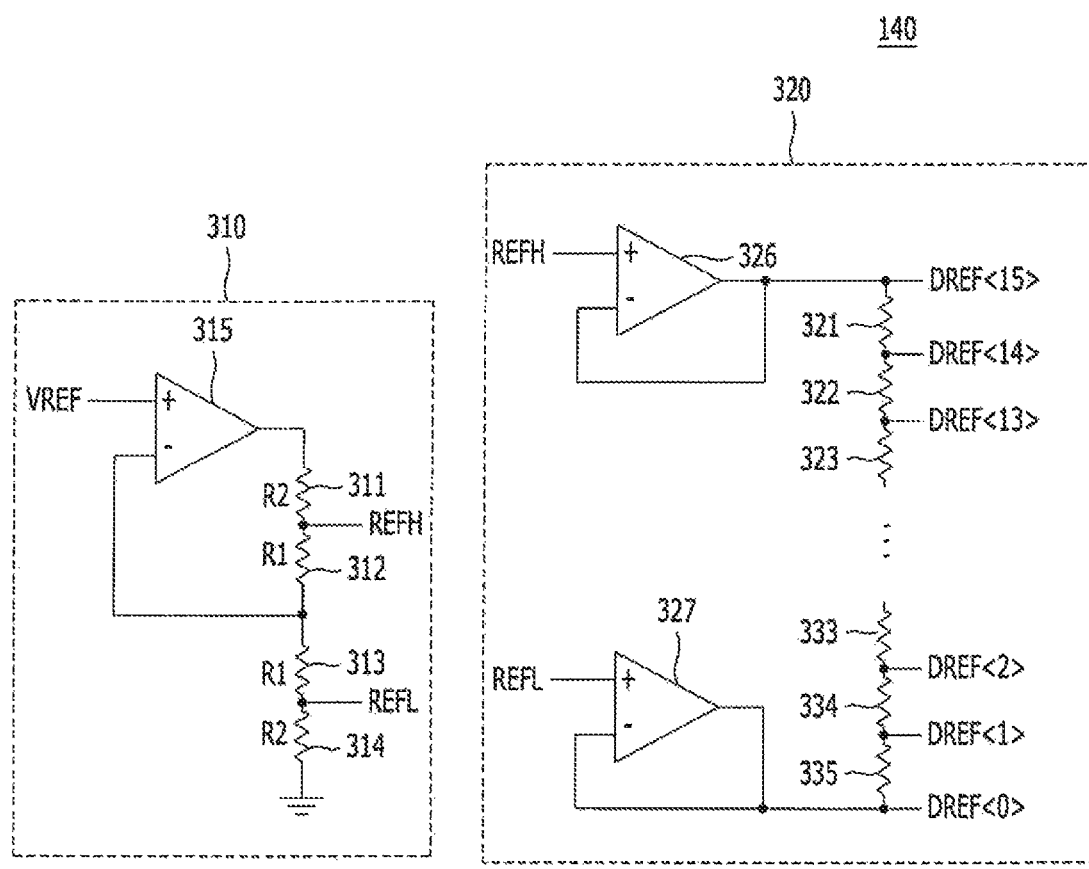
FIG. 3 is a circuit diagram of a comparison voltage generation circuit shown in FIG. 1.

FIG. 3 is a circuit diagram illustrating the comparison voltage generation circuit 140. Referring to FIG. 3, the comparison voltage generation circuit 140 may include first and second voltage generators 310 and 320. The first voltage generator 310 may generate an upper limit voltage REFH having a higher level than the reference voltage and a lower limit voltage REFL having a lower level than the reference voltage VREF, and the second voltage generator 320 may generate a plurality of comparison voltages DREF<0:15> having levels between the upper limit voltage REFH and the lower limit voltage REFL.

The first voltage generator 310 may include resistors 311 to 314 and an operational amplifier 315. The resistors 311 to 314 may be coupled in series between an output terminal of the operational amplifier 315 and a ground terminal. "R1" and "R2" may represent the resistance of the resistors 311 to 314. The operational amplifier 315 may have a positive input terminal (+) configured to receive the reference voltage VREF and a negative input terminal (−) coupled to a node between the resistors 312 and 313. The voltage level of the negative input terminal (−) may be equalized to the reference voltage VREF by the operation of the operational amplifier 315. In the end, the voltage level of the negative input terminal (−) may be generated at the lower limit voltage REFL (=(1−R1/(R1+R2))*VREF) or the upper limit voltage REFH (=(1+R1/(R1+R2))*VREF).

The second voltage generator 320 may include resistors 321 to 335 and operational amplifiers 326 and 327. The operational amplifiers 326 and 327 may be coupled to form a voltage follower. Therefore, an output terminal of the operational amplifier 326 may have the same level as the upper limit voltage REFH, and an output terminal of the operational amplifier 327 may have the same level as the lower limit voltage REFL. The comparison voltages DREF<0:15> generated through voltage division operations of the resistors 321 to 335 may have levels between the upper limit voltage REFH and the lower limit voltage REEL. The resistors 321 to 335 may have the same resistance. Therefore, the comparison voltages DREF<0:15> may have the same voltage difference therebetween. For example, a voltage difference between the comparison voltage DREF<1> and the comparison voltage DREF<2> may be equal to a voltage difference between the comparison voltage DREF<13> and the comparison voltage DREF<14>.

Referring back to FIG. 1, the transmission gates T1_0 to T1_N-1 may be turned on/off in response to select signals SEL<0:N-1>. When the transmission gates T1_0 to T1_N-1 are turned on, the transmission gates T1_0 to T1_N-1 may couple the corresponding TSVs among the TSVs TSV_0 to TSV_N-1 to a common node. The select signals SEL<0:N-1> may be used to select a TSV corresponding to a defect detection target, among the TSVs TSV_0 to TSV_N-1. For example, when the select signal SEL<3> is activated, the TSV TSV_3 may be selected to determine whether the TSV TSV_3 has a defect, and when the select signal SEL<N-1> is activated, the TSV TSV_N-1 may be selected to determine whether the TSV TSV_N-1 has a defect. The inverters I1_0 to I1_N-1 may invert the select signals SEL<0:N-1>, and transfer the inverted signals to the transmission gates T1_0 to T1_N-1. The transmission gates T1_0 to T1_N-1 may be used to determine whether the plurality of TSVs TSV_0 to TSV_N-1 have a defect, using one comparison circuit 150. Therefore, when the semiconductor device 100 has only one TSV corresponding to a defect detection target or includes a plurality of comparison circuits, the transmission gates T1_0 to T1_N-1 may be omitted.

The comparison circuit 150 may compare the voltage of the TSV selected by the select signals SEL<0:N-1> to the voltage levels of the plurality of comparison voltages DREF<0:15>, and determine whether the selected TSV has a defect.

Figure 4:
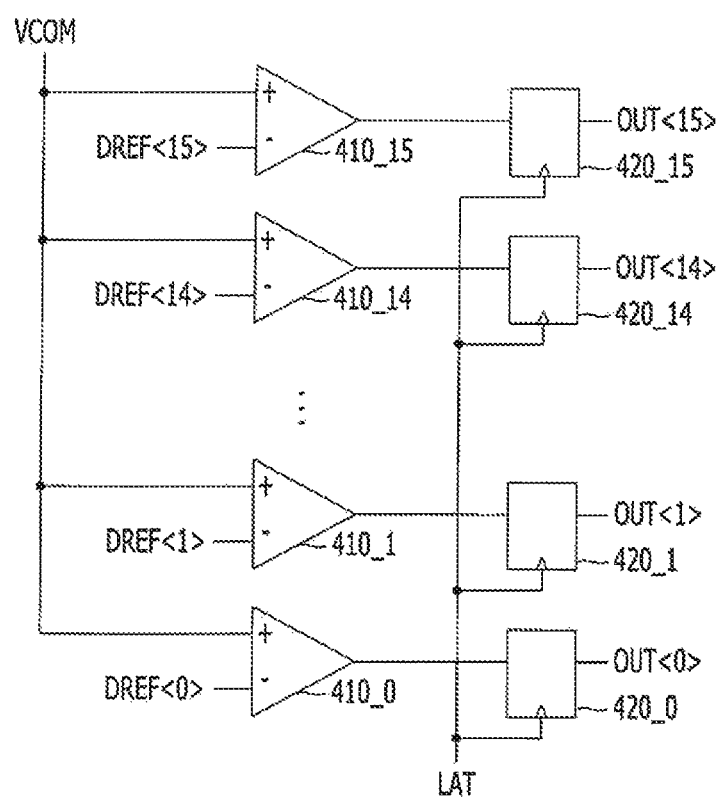
FIG. 4 is a circuit diagram of a comparison circuit shown in FIG. 1.

FIG. 4 is a circuit diagram illustrating the comparison circuit 150. Referring to FIG. 4, the comparison circuit 150 may include a plurality of comparators 410_0 to 410_15 and a plurality of 1-bit storages 420_0 to 420_15. The plurality of comparators 410_0 to 410_15 may compare the voltage of the common node VCOM to the voltage levels of the plurality of comparison voltages DREF<0:15>. The plurality of 1-bit storages 420_0 to 420_15 may store the respective comparison results of the plurality of comparators 410_0 to 410_15 in response to a storage control signal LAT. Each of the plurality of 1-bit storages 420_0 to 420_15 may include a flip-flop (e.g., a D flip-flop) configured to store the comparison results of the respective comparators 410_0 to 410_15 in synchronization with a rising edge of the storage control signal LAT. Further, each of the plurality of 1-bit storages 420_0 to 420_15 may include a latch configured to latch the comparison results of the respective comparators 410_0 to 410_15 in response to the storage control signal LAT. The comparison results OUT<0:15> stored in the 1-bit storages may serve as an index indicating characteristic of the TSV coupled to the common node VCOM with respect to the reference TSVs TSV_REF_0 to TSV_REF_3.

Referring back to FIG. 1, the output circuit 170 may output the comparison results OUT<0:15> generated by the comparison circuit 150 to the outside of the semiconductor device 100. Accordingly, even outside the semiconductor device 100, it is possible to recognize the characteristics of the TSVs TSV_0 to TSV_N-1 or whether the TSVs TSV_0 to TSV_N-1 have a defect, using the comparison results OUT<0:15> outputted through the output circuit 170.

The control circuit 160 may generate the TSV scan enable signal TSV_SCAN_EN, the select signals SEL<0:N-1> and the storage control signal LAT, in order to determine whether the TSVs TSV_0 to TSV_N-1 have a defect. The TSV scan enable signal TSV_SCAN_EN may be transferred to the upper integrated circuit chip 110 from the lower integrated circuit chip 120 through a TSV 101.

Figure 5:
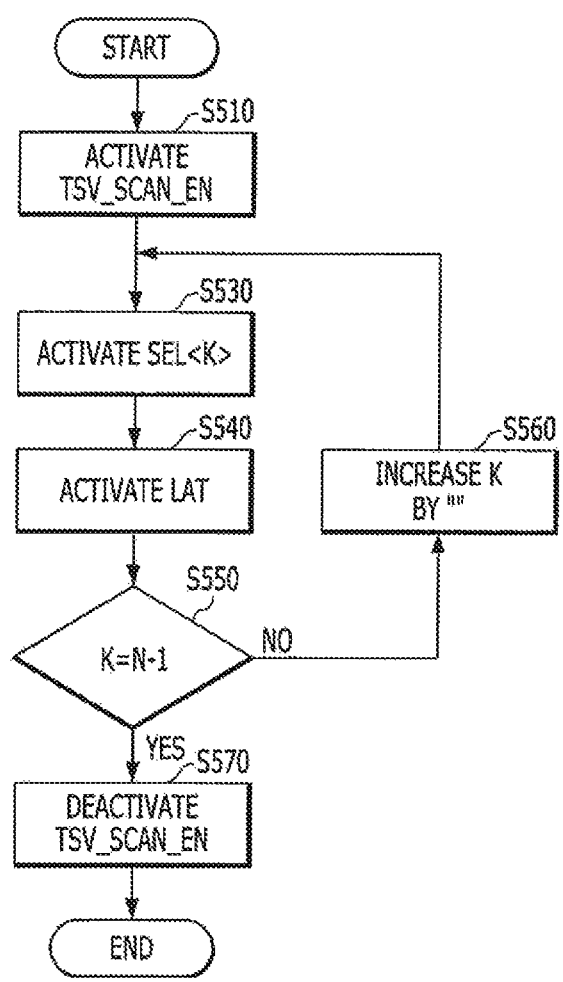
FIG. 5 is a flow chart illustrating an operation of a control circuit shown in FIG. 1.

FIG. 5 is a flow chart illustrating a method of operation of the control circuit 160. Referring to FIG. 5, the control circuit 160 may activate the TSV scan enable signal TSV_SCAN_EN at step S510. When the TSV scan enable signal TSV_SCAN_EN is activated, the reference generation block 130 may be enabled to generate the reference voltage VREF, and the comparison voltage generation circuit 140 may generate the plurality of comparison voltages DREF<0:15> using the reference voltage VREF. Furthermore, the plurality of sourcing circuits 111_0 to 111_N−1 and the plurality of sinking circuits 121_0 to 121_N−1 may be enabled.

The control circuit 160 may activate the Kth select signal SEL<K> at step S530. Then, the voltage of the Kth TSV may be compared to the plurality of comparison voltages DREF<0:15> by the comparators 410_0 to 410_15. The control circuit 160 may activate the storage control signal LAT at step S540. When the storage control signal LAT is activated, the comparison results of the comparators 410_0 to 410_15 may be stored in the 1-bit storages 420_0 to 420_15, and the comparison results OUT<0:15> stored in the 1-bit storages 420_0 to 420_15 may be outputted through the output circuit 170.

At step S550, the current value of K is checked. When K is not (N−1) (NO at step S550), the value of K may be increased by "1" at step S560, and steps S530 and S540 may be performed again.

When K is (N−1) (YES at step S550), the control circuit 160 may deactivate the TSV scan enable signal TSV_SCAN_EN at step S570, because the characteristics of all the TSVs TSV_0 to TSV_N−1 have been completely detected.

In accordance with the described embodiment, it is possible to correctly determine whether a TSV has a defect.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a first integrated chip;
   a second integrated chip;
   a plurality of reference through-chip vias formed through the first and second integrated circuit chips; and
   at least a normal through-chip via formed through the first and second integrated circuit chips,
   wherein the first integrated circuit chip comprises:
      a plurality of reference sourcing circuits suitable for sourcing a reference current to the respective reference through-chip vias; and
      at least a sourcing circuit suitable for sourcing the is reference current to the normal through-chip via, and
   wherein the second integrated circuit chip comprises:
      a plurality of reference sinking circuits suitable for sinking currents flowing through the respective reference through-chip vias;
      a line suitable for electrically coupling the plurality of reference through-chip vias;
      a comparison voltage generation circuit suitable for generating a plurality of comparison voltages based on a voltage of the line;
      at least a sinking circuit suitable for sinking a current flowing through the normal through-chip via; and
      a comparison circuit suitable for comparing the voltage of the normal through-chip via to the plurality of comparison voltages.

2. The semiconductor device of claim 1, wherein the first integrated circuit chip further comprises a first transmitter/receiver circuit suitable for transmitting/receiving a signal through the normal through-chip via, and wherein the second integrated circuit chip further comprises a second transmitter/receiver for transmitting/receiving the signal through the normal through-chip via.

3. The semiconductor device of claim 1, wherein the comparison voltage generation circuit comprises:
   a first voltage generator suitable for generating an upper limit voltage higher than the voltage of the line and a lower limit voltage lower than the voltage of the line; and
   a second voltage generator suitable for generating the plurality of comparison voltages having levels between the upper limit voltage and the lower limit voltage.

4. The semiconductor device of claim 3, wherein the first voltage generator comprises:
   a plurality of first resistors coupled in series between a first node and a ground terminal; and
   a first operational amplifier having a positive input terminal for receiving the voltage of the line, a negative input terminal coupled to a second node corresponding to one of nodes between the respective first resistors, and an output terminal coupled to the first node,
   wherein the upper limit voltage is generated at a node having a higher voltage level than the second node, among the nodes between the respective first resistors, and
   the lower limit voltage is generated at a node having a lower voltage level than the second node, among the nodes between the respective first resistors.

5. The semiconductor device of claim 4, wherein the second voltage generator comprises:
   a plurality of second resistors coupled between a third node and a fourth node;
   a second operational amplifier having a positive input terminal for receiving the upper limit voltage and a negative input terminal and output terminal coupled to the third node; and
   a third operational amplifier having a positive input terminal for receiving the lower limit voltage and a negative input terminal and output terminal coupled to the fourth node, and
   wherein the plurality of comparison voltages are generated at nodes between the respective second resistors.

6. The semiconductor device of claim 1, wherein the comparison circuit comprises:
   a plurality of comparators suitable for comparing the voltage of the normal through-chip via to the plurality of comparison voltages; and
   a plurality of 1-bit storages suitable for storing the comparison results of the plurality of comparators.

7. The semiconductor device of claim 2, wherein, when the first and second transmitter/receiver circuits are enabled, the sourcing circuit and the sinking circuit are disabled.

8. The semiconductor device of claim 1, wherein the second integrated circuit chip further comprises an output circuit suitable for externally outputting the comparison result of the comparison circuit.

9. The semiconductor device of claim 6, wherein each of the plurality of 1-bit storages includes a latch or a flip-flop.

10. An integrated circuit chip comprising:
    a plurality of reference sinking circuits suitable for sinking currents from a plurality of reference through-chip vias, respectively;
    a line suitable for electrically coupling the plurality of reference through-chip vias;

a comparison voltage generation circuit suitable for generating a plurality of comparison voltages based on a voltage of the line;
at least a sinking circuit suitable for sinking a current from at least a normal through-chip via; and
a comparison circuit suitable for comparing a voltage of the normal through-chip via to the plurality of comparison voltages.

11. The integrated circuit chip of claim 10, wherein a reference current is externally sourced to the plurality of reference through-chip vias and the normal through-chip via.

12. The integrated circuit chip of claim 10, further comprising a transmitter/receiver circuit suitable for transmitting/receiving a signal through the normal through-chip via.

13. The integrated circuit chip of claim 10, wherein the comparison voltage generation circuit comprises:
a first voltage generator suitable for generating an upper limit voltage higher than the voltage of the line and a lower limit voltage lower than the voltage of the line; and
a second voltage generator suitable for generating the plurality of comparison voltages having levels between the upper limit voltage and the lower limit voltage.

14. The integrated circuit chip of claim 13, wherein the first voltage generator comprises:
a plurality of first resistors coupled in series between a first node and a ground terminal; and
a first operational amplifier having a positive input terminal for receiving the voltage of the line, a negative input terminal coupled to a second node corresponding to one of nodes between the respective first resistors, and an output terminal coupled to the first node,
wherein the upper limit voltage is generated at a node having a higher voltage level than the second node, among the nodes between the respective first resistors, and
the lower limit voltage is generated at a node having a lower voltage level than the second node, among the nodes between the respective first resistors.

15. The integrated circuit chip of claim 14, wherein the second voltage generator comprises:
a plurality of second resistors coupled between the third node and a fourth node;
a second operational amplifier having a positive input terminal for receiving the upper limit voltage and a negative input terminal and output terminal coupled to the third node; and
a third operational amplifier having a positive input terminal for receiving the lower limit voltage and a negative input terminal and output terminal coupled to the fourth node, and
wherein the plurality of comparison voltages are generated at nodes between the respective second resistors.

16. The integrated circuit chip of claim 10, wherein the comparison circuit comprises:
a plurality of comparators suitable for comparing the voltage of the normal through-chip via to the plurality of comparison voltages; and
a plurality of 1-bit storages suitable for storing the comparison results of the plurality of comparators.

17. The integrated circuit chip of claim 12, wherein, when the transmitter/receiver circuit is enabled, the sinking circuit is disabled.

18. The integrated circuit chip of claim 10, wherein each of the reference sinking circuits has the same current sinking ability as the sinking circuit.

19. The integrated circuit chip of claim 5, wherein each of the plurality of 1-bit storages includes a latch or a flip-flop.

* * * * *